United States Patent
Hsiao et al.

(10) Patent No.: US 8,892,968 B2
(45) Date of Patent: Nov. 18, 2014

(54) BIT-LEVEL MEMORY CONTROLLER AND A METHOD THEREOF

(75) Inventors: Po-Wen Hsiao, Hsinchu (TW); Hung-Wen Hsieh, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 258 days.

(21) Appl. No.: 13/313,714

(22) Filed: Dec. 7, 2011

(65) Prior Publication Data

US 2013/0151752 A1    Jun. 13, 2013

(51) Int. Cl.
*G06F 11/00* (2006.01)
(52) U.S. Cl.
USPC .......................................................... 714/710
(58) Field of Classification Search
USPC .......................................................... 714/710
See application file for complete search history.

(56) References Cited

U.S. PATENT DOCUMENTS

| | | | | |
|---|---|---|---|---|
| 5,200,959 A | * | 4/1993 | Gross et al. | 714/723 |
| 5,297,148 A | * | 3/1994 | Harari et al. | 714/710 |
| 6,035,432 A | * | 3/2000 | Jeddeloh | 714/763 |
| 2009/0137070 A1 | * | 5/2009 | Co et al. | 438/17 |
| 2012/0075944 A1 | * | 3/2012 | Ide et al. | 365/200 |
| 2012/0297245 A1 | * | 11/2012 | Li et al. | 714/15 |

* cited by examiner

*Primary Examiner* — Michael Maskulinski
(74) *Attorney, Agent, or Firm* — Donald E. Stout; Stout, Uxa & Buyan, LLP (57) ABSTRACT

The present invention is directed to a bit-level memory controller and method adaptable to managing defect bits of a non-volatile memory. A bad column management (BCM) unit retrieves a bit-level mapping table, in which defect bits are respectively marked, based on which the BCM unit constructs a bit-level script (BLS) that contains a plurality of entries denoting defect-bit groups respectively. An internal buffer is configured to store data managed by the BCM unit according to the BLS.

12 Claims, 10 Drawing Sheets

BIT-LEVEL MEMORY CONTROLLER AND A METHOD THEREOF

BACKGROUND OF THE INVENTION

1. Field of the Invention

The present invention generally relates to a non-volatile memory, and more particularly to a bit-level memory controller adaptable to managing defect bits of a flash memory.

2. Description of Related Art

Flash memory is a non-volatile solid state memory device that can be electrically erased and reprogrammed. Due to imperfection of semiconductor manufacturing, the flash memory may inevitably contain bad (or fault) bit cell or cells, which cannot correctly store data.

Figure 1:
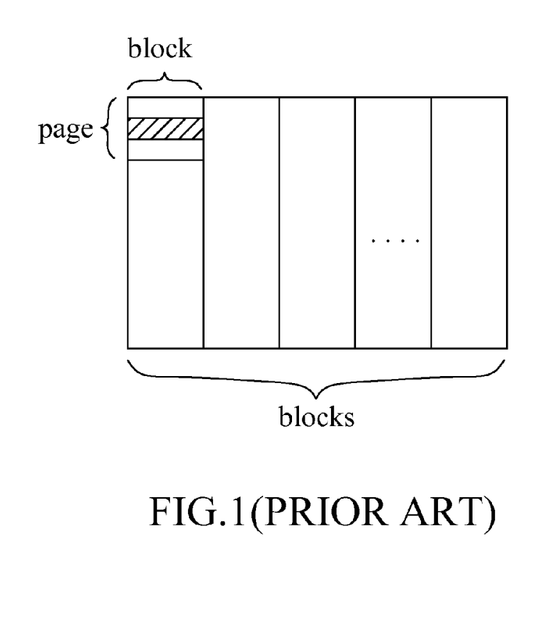
FIG. 1 schematically shows data blocks of a flash memory.

FIG. 1 schematically shows data blocks of a flash memory. The flash memory is made up of a number of blocks, each of which contains a number of pages. The page is a basic programming unit of the flash memory. As mentioned above, the flash may inevitably contain bad bit cell(s) as depicted by slant lines in the figure. According to a conventional method called block-level sorting, a block containing bad cell(s) is marked as a bad (or invalid) block. Accordingly, the entire block of the marked-up block will not be used as a valid block in its entirety, even if only one page contains the bad cell(s).

Figure 2:
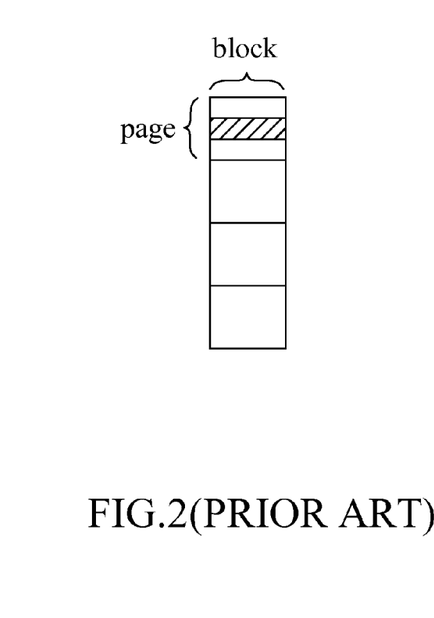
FIG. 2 schematically shows a data block of a flash memory.

FIG. 2 schematically shows a data block of a flash memory. The block is usually made up of a number of pages. As shown in the figure, one page contains bad bit cell(s) as depicted by slant lines. According to a conventional method called page-level sorting, a page containing bad cell(s) is marked as a bad page. Accordingly, the entire page of the marked-up page will not be used as a valid page in its entirety, even if only one sector contains the bad cell(s).

Figure 3:
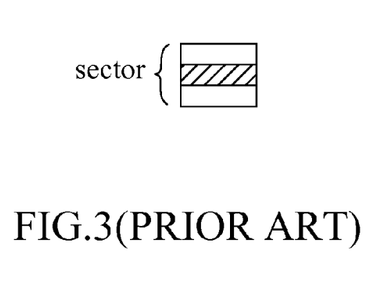
FIG. 3 schematically shows a data sector of a flash memory.

FIG. 3 schematically shows a data sector of a flash memory. The sector is usually made up of a number (e.g., 512) of bytes. As shown, in the figure, the sector contains one or more bad bytes as depicted by slant lines. According to a conventional method called partial-sector-level sorting, a sector containing bad cell(s) is marked as a bad sector. Accordingly, the entire sector of the marked-up sector will not be used as a valid sector in its entirety, even if only one byte contains the bad cell(s).

Figure 4A:
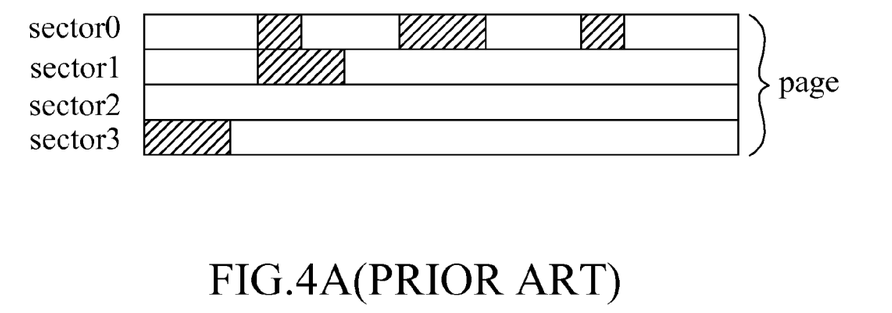
FIG. 4A schematically shows an exemplary page made up of four sectors.
Figure 4B:
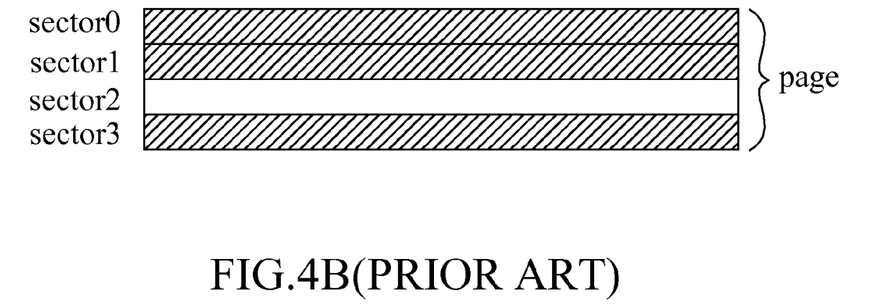
FIG. 4B schematically shows a valid sector in the page of FIG. 4A.

Although the partial-sector-level sorting improves over the page-level sorting and the block-level sorting regarding the usage efficiency of flash memory cells, there is still a great amount of non-fault memory cells to be wasted. FIG. 4A schematically shows an exemplary page made up of four sectors (i.e., sector 0 to sector 3), within which the first sector (sector 0) has three defect-bit groups, the second sector (sector 1) has one defect-bit group and the fourth sector (sector 3) has one defect-bit group. According to the partial-sector-level sorting as mentioned above, the first, the second, and the fourth sectors are marked invalid, and only the third sector (sector 2) can be used as a valid sector, as shown in FIG. 4B. In other words, the usage efficiency of the entire page is only one-fourth (or 25%).

For the reason that conventional flash memory sorting methods could not efficiently utilize the flash memory, a need has arisen to propose a novel scheme to further improve over the conventional sorting methods.

SUMMARY OF THE INVENTION

In view of the foregoing, it is an object of the embodiment of the present invention to provide a bit-level memory controller and controlling method that adopt a bad column management (BCM) technique to skip defect bits according to a generated bit-level script that describes locations of the defect bits. The embodiment is no longer constrained by a fixed building unit such as block or page as in the conventional sorting methods.

According to one embodiment, a bit-level memory controller comprises a memory bus interface controller, a bad column management (BCM) unit, an internal buffer and a host bus interface controller. The memory bus interface controller is configured to control data communication in a memory bus disposed between the non-volatile memory and the memory controller. The BCM unit is configured to retrieve a bit-level mapping table, in which defect bits are respectively marked, based on which the BCM unit constructs a bit-level script (BLS) that contains a plurality of entries denoting defect-bit groups respectively. The internal buffer is configured to store data managed by the BCM unit according to the BLS. The host bus interface controller is configured to control data communication in a host bus disposed between a host and the memory controller.

DETAILED DESCRIPTION OF THE INVENTION

Figure 5:
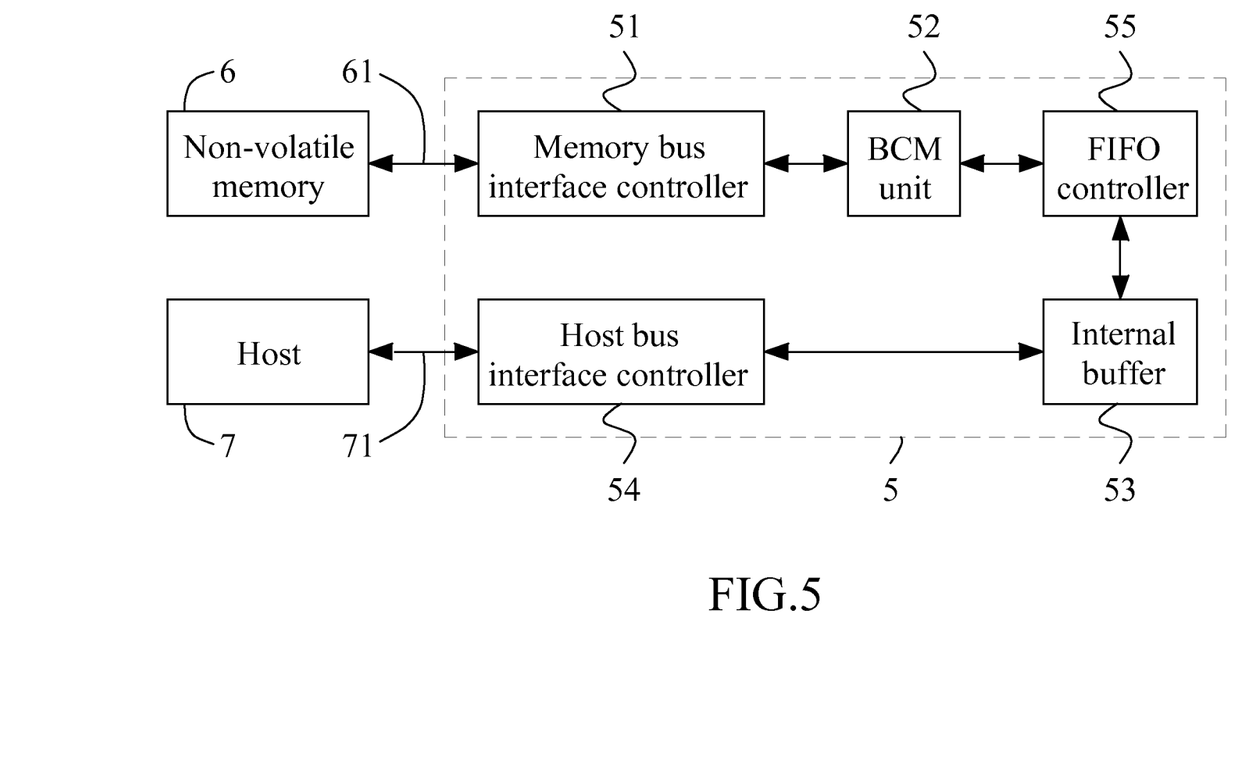
FIG. 5 shows a block diagram of a bit-level memory controller adaptable to managing defect bits of a non-volatile memory according to one embodiment of the present invention.

FIG. 5 shows a block diagram of a bit-level memory controller adaptable to managing defect bits of a non-volatile memory 6 according to one embodiment of the present invention. Although the embodiment illustrated below is adapted to a NAND flash memory, the embodiment, however, may be adapted, in general, to a non-volatile memory other than the flash memory.

Figure 6:
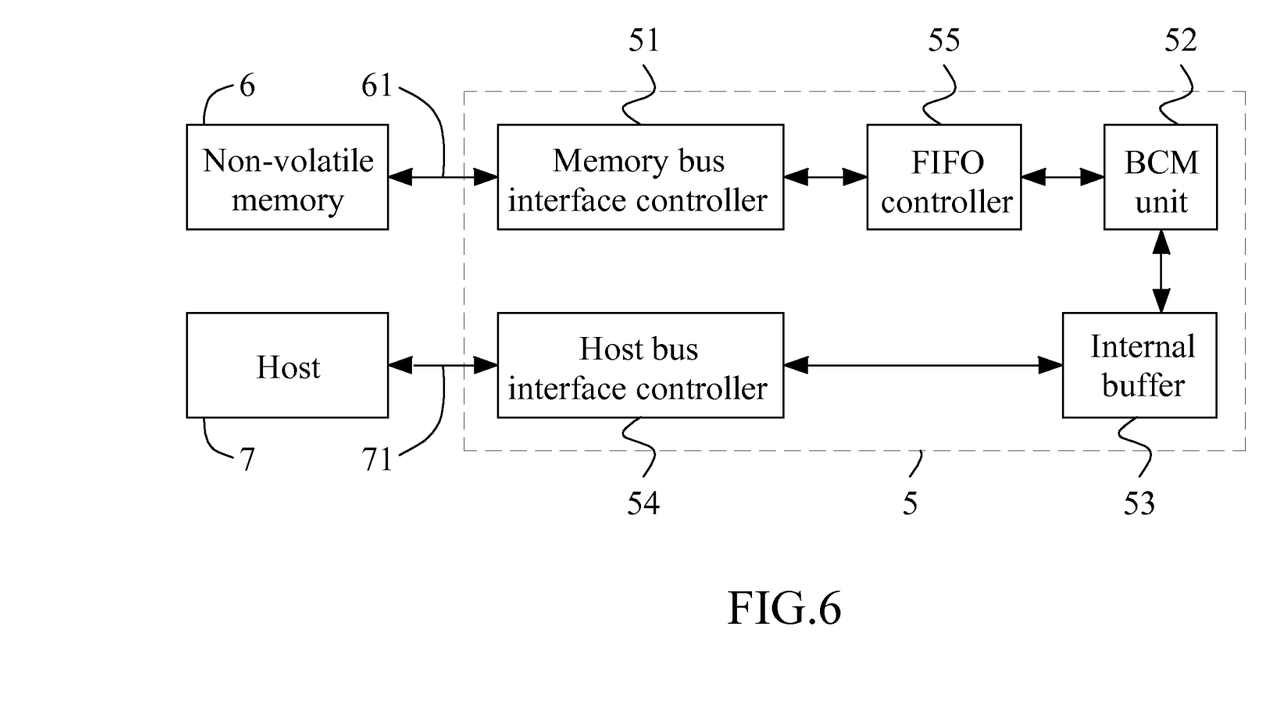
FIG. 6 shows a block diagram of a bit-level memory controller adaptable to managing defect bits of a non-volatile memory according to an alternative embodiment of the present invention.

In the embodiment, the bit-level memory controller 5 primarily includes a memory bus interface controller 51, a bad column management (BCM) unit 52, an internal buffer 53, and a host bus interface controller 54. The embodiment may selectively further include a first-in-first-out (FIFO) controller 55 that is disposed between the BCM unit 52 and the internal buffer 53. In an alternative embodiment, as shown in FIG. 6, the FIFO controller 55 is disposed between the memory bus interface controller 51 and the BCM unit 52.

Specifically, the memory bus interface controller 51 controls the data communication in a memory bus 61 disposed between the flash memory 6 and the memory controller 5. The host bus interface controller 54 controls the data communication in a host bus 71 disposed between a host (e.g., a computer) 7 and the memory controller 5. The optional FIFO controller 55 may perform, for example, error control coding (ECC) or encryption/decryption on the data.

Figure 7:
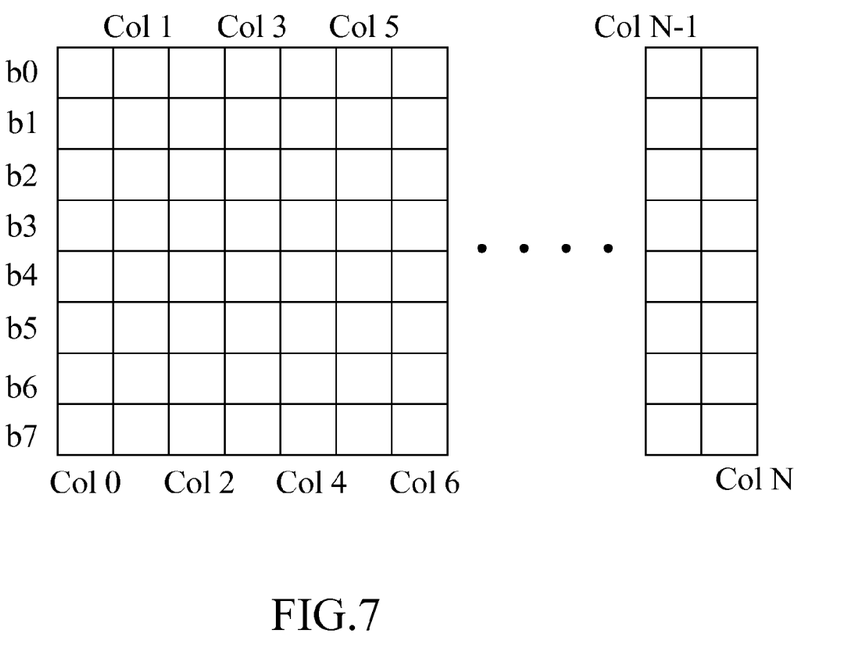
FIG. 7 shows an exemplary bit-level mapping table having a size of one page.

The BCM unit 52 of the embodiment retrieves (or receives) a bit-level mapping table, in which defect bit or bits are respectively marked (or labeled). FIG. 7 shows an exemplary bit-level mapping table having a size of one page that is made up of (N+1) bytes column 0 through column N. In the example, each byte is made up of eight bits, i.e., bits b0 to b7. It is noted that the bit-level mapping table is generated beforehand, for example, by a sorter (not shown in the figure) that sorts bits throughout the flash memory 6 to determine usability of each bit.

Subsequently, based on the bit-level mapping table, the BCM unit 52 constructs a bit-level script (BLS) that contains a plurality of entries denoting defect-bit groups respectively. Table 1 shows an exemplary bit-level script containing 48 entries. Each entry of the bit-level script includes a start bit (e.g., SB1) denoting the location of the beginning defect bit of the corresponding defect-bit group (e.g., 1st defect-bit group), and a skip bit range (e.g., SBR1) denoting the length of the corresponding defect-bit group.

TABLE 1

| BLS | 1st | 2nd | 3rd | ... | 48th |
|---|---|---|---|---|---|
| Start bit | SB1 | SB2 | SB3 | ... | SB48 |
| Skip bit range | SBR1 | SBR2 | SBR3 | ... | SBR48 |

Table 2 exemplifies the bit-level script with real values. For example, the 1st defect-bit group (BLS1) begins with the bit at 0x20 (in hexadecimal format) and has eight (8) defect bits totally. In other words, the first defect-bit group includes eight bits 0x20 through 0x27. Although the bit-level script (BLS) of the embodiment processes the bit-cells down to a single bit-cell, it is noted that the BLS in other embodiments may process the bit-cells down to more than one bit-cell, that is, a bits-group (e.g., bits-group of eight bits or a byte). In this respective, each entry of the bit-level script includes a start bit (e.g., SB1) denoting the location of a first bit of the bits-group containing the beginning defect bit of the corresponding defect-bit group, and a skip bit range (e.g., SBR1) denoting the length of the bits-group(s) containing the corresponding defect-bit group.

In a data read operation, data (including fault data stored in the defect-bit locations) are transferred from the flash memory 6, for example, sector after sector, to the memory bus interface controller 51 via the memory bus 61 (e.g., a bytewise memory bus). The transferred data are then received and managed by the BCM unit 52. The BCM unit 52 manages the received data according to the bit-level script, and then moves the managed data to the internal buffer 53. Specifically speaking, the BCM unit 52 filters the received data by skipping (or bypassing) the received (fault) data stored in the defect-bit locations denoted by the bit-level script, and then moves the correct (or non-fault) data to the internal buffer 53. The moved data are therefore aggregated and continuously placed in the internal buffer 53 without being interrupted by any fault data. In other words, the managed data as now placed in the internal buffer 53 present an integral unit of all correct data. Afterwards, the managed data of the internal buffer 53 are transferred to the host bus interface controller 54 and finally to the host 7, for example, sector after sector, via the host bus 71 (e.g., a bytewise memory bus).

In a data write operation, data are transferred from the host 6 to the host bus interface controller 54 via the host bus 71. The transferred data are then placed in the internal buffer 53. Subsequently, the BCM unit 52 moves the data of the internal buffer 53 to the memory bus interface controller 51, according to the bit-level script (BLS), and then to the flash memory 6 via the memory bus 61. Specifically speaking, the BCM unit 52 moves the data to the flash memory 6 when the target address of the data does not hit the BLS, indicating that the corresponding address in the flash memory 6 is valid (or non-fault). Otherwise, the BCM unit 52 appends a dummy bit to the flash memory 6 when the target address of the data hits the BLS, indicating that the corresponding address in the flash memory 6 is invalid (or fault).

Figure 8:
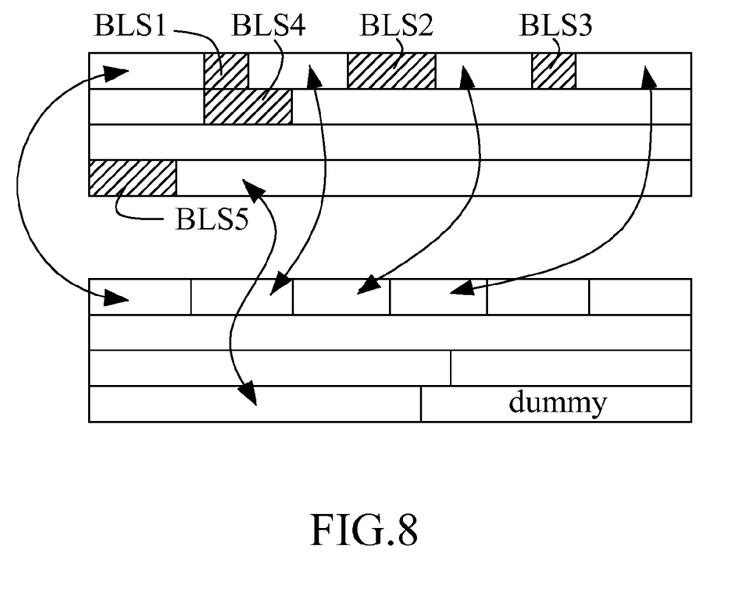
FIG. 8 shows an example illustrative of data management of the BCM unit of FIG. 5/6 according to the embodiment.

FIG. 8 shows an example illustrative of data management of the BCM unit according to the embodiment. Specifically, the top of the figure shows a page of the flash memory 6 before the data are managed by the BCM unit 52. As shown in the figure, the page is made up of four sectors (or rows), within which the first sector has three defect-bit groups (i.e., BLS1 to BLS3), the second sector has one defect-bit group (i.e., BLS4) and the fourth sector has one defect-bit group (i.e., BLS5). The bottom of the figure shows a page of the internal buffer 53 after the data are managed and moved to the internal buffer 53. As described above, the BCM unit 52 manages the received data according to the bit-level script, and then moves the managed data to the internal buffer 53, by skipping (or bypassing) the received (fault) data and moving the correct (or non-fault) data to the internal buffer 53, thereby presenting an integral unit of all correct data. It is noted that the locations without valid data at the rear part of the internal buffer 53 may be stuffed with dummy bits.

In contrast, the conventional memory controller, such as the block-level or page-level memory controller, lacks the BCM unit and the bit-level script of the present embodiment. Moreover, the conventional memory controller uses, at the most, a mapping table to identify non-defect block(s) or page

TABLE 2

| BLS | 1st | 2nd | 3rd | 4th | 5th | 6th | 7th | ... | 48th |
|---|---|---|---|---|---|---|---|---|---|
| Start bit | 0x20 | 0x70 | 0x270 | 0x1020 | 0x3000 | 0xFFFF | 0xFFFF | ... | 0xFFFF |
| Skip bit range | 8 | 0x10 | 0x08 | 0x10 | 0x30 | 0xFFFF | 0xFFFF | ... | 0xFFFF |

(s). More importantly, the data placed in an internal buffer, if it exists, of the conventional memory controller present discrete units of data interrupted by fault data. To be more specific, the conventional memory controller adopts a fixed building unit (e.g., block or page) of data. As a result, substantial amount of correct (or non-defect) memory cells are wasted as illustrated in FIG. 4B. The present embodiment, however, renounces the adoption of the fixed building unit of data, and thus prevents the disadvantages of the conventional memory controller.

Figure 9A:
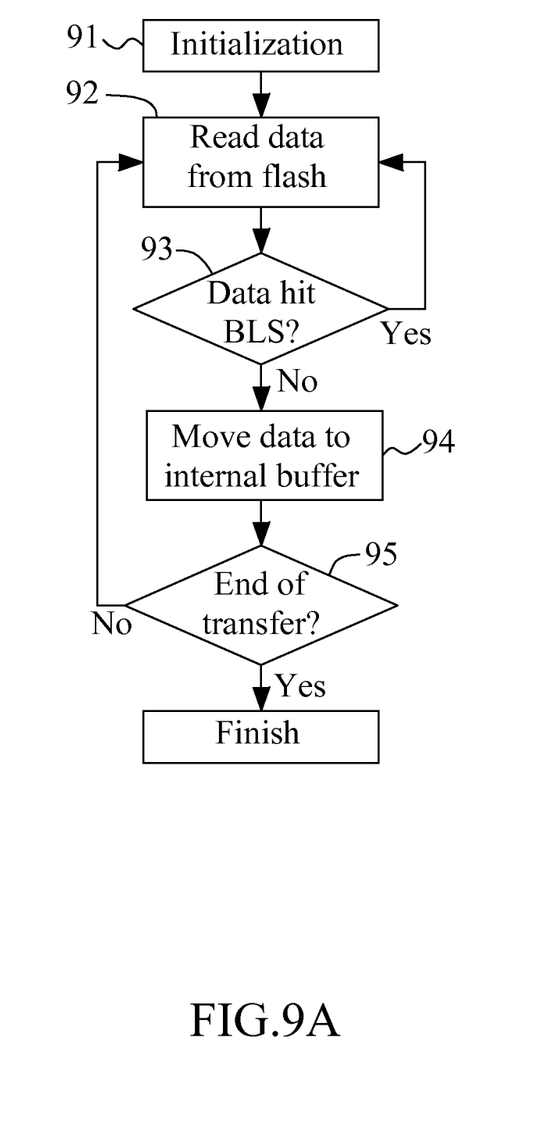
FIG. 9A shows a flow chart of reading data from the flash memory according to the embodiment of the present invention.
Figure 9B:
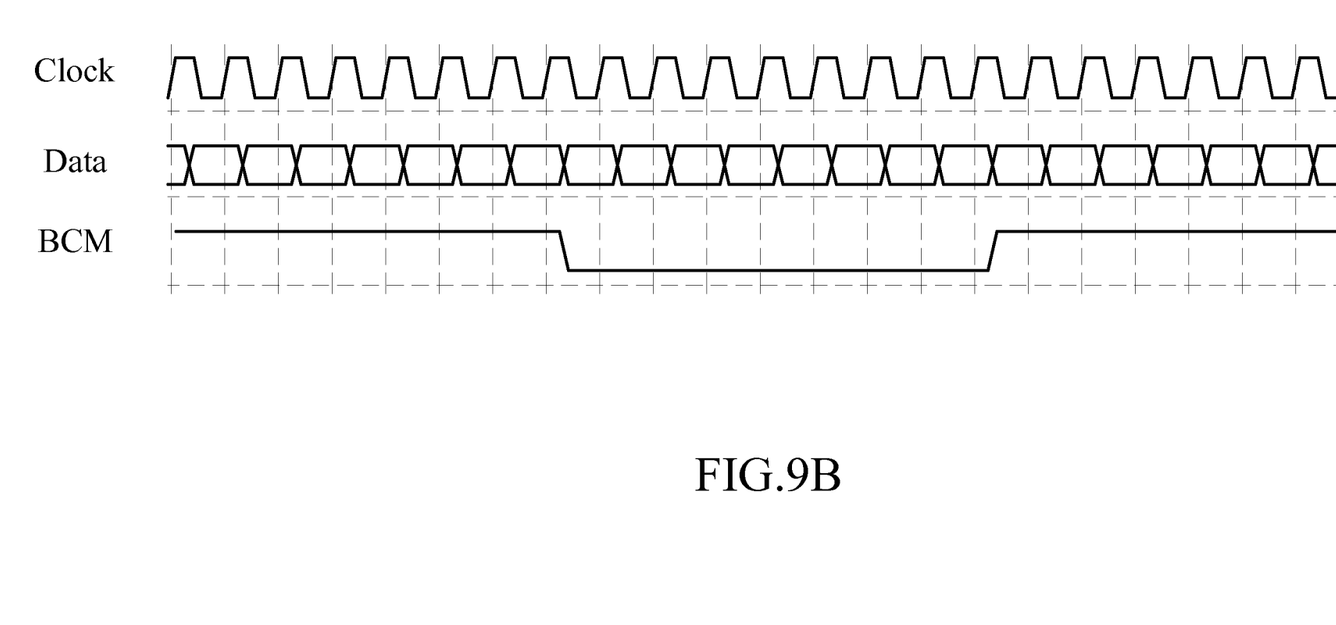
FIG. 9B shows pertinent signal waveforms according to the flow of FIG. 9A.

FIG. 9A shows a flow chart of reading data from the flash memory 6 according to the embodiment of the present invention, and FIG. 9B shows pertinent signal waveforms according to the flow of FIG. 9A. Specifically, after system initialization (step 91), data are read from the flash memory 6 (step 92). In step 93, the BCM unit 52 checks whether the received data hits the bit-level script (BLS). If the received data hits the BLS, an internal signal BCM goes low and the received data is discarded. Otherwise, if the received data does not hit the BLS, the internal signal BCM goes (or maintains) high and the received data is moved to the internal buffer 53 (step 94). The steps 92-94 are repeatedly performed until the end of transfer has been reached (step 95).

Figure 10A:
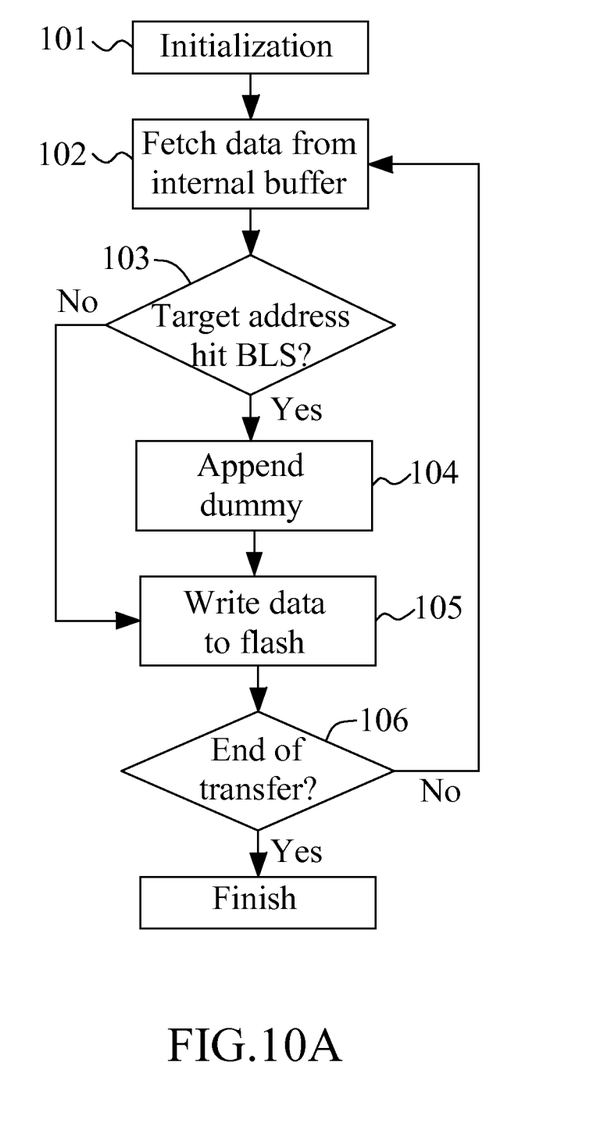
FIG. 10A shows a flow chart of writing data to the flash memory according to the embodiment of the present invention.
Figure 10B:
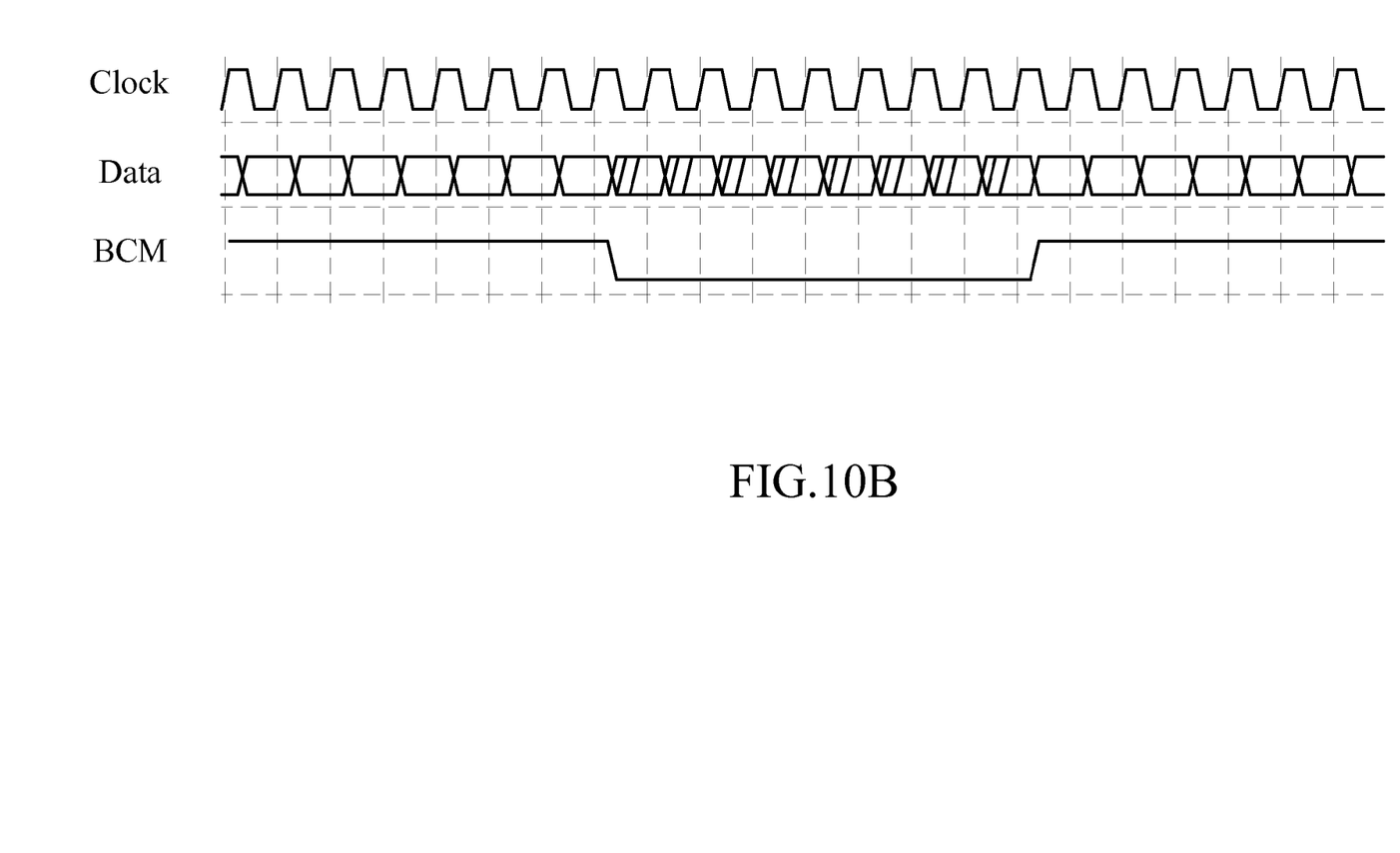
FIG. 10B shows pertinent signal waveforms according to the flow of FIG. 10A.

FIG. 10A shows a flow chart of writing data to the flash memory 6 according to the embodiment of the present invention, and FIG. 10B shows pertinent signal waveforms according to the flow of FIG. 10A. Specifically, after system initialization (step 101), data are fetched from the internal buffer 53 (step 102). In step 103, the BCM unit 52 checks whether the target address hits the bit-level script (BLS). If the target address does not hit the BLS, an internal signal BCM goes (or maintains) high, and data is fetched from the internal buffer 53 and then written to the flash memory 6 (step 105). If the target address hits the BLS, the internal signal BCM goes low, and a dummy data is appended (step 104) and then written to the flash memory 6 (step 105). The steps 102-105 are repeatedly performed until the end of transfer has been reached (step 106).

Figure 11:
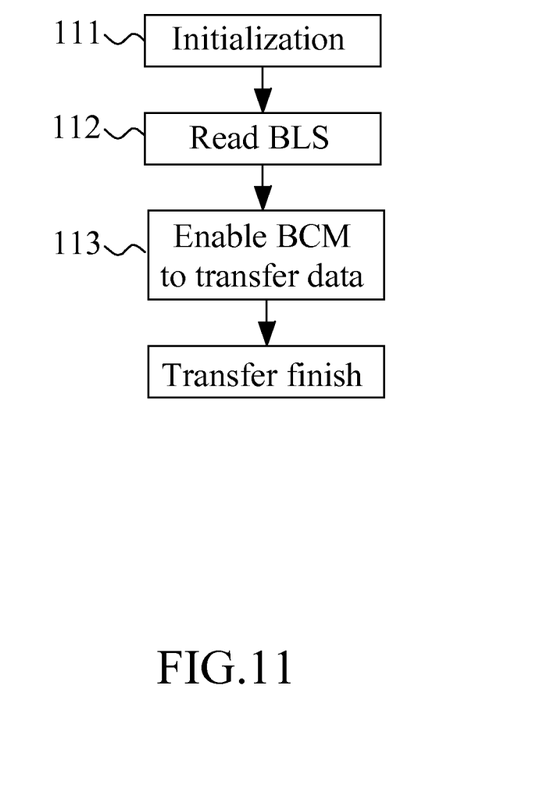
FIG. 11 shows a flow chart for a software program that is used to carry out the read operation (FIG. 9A/9B) and the write operation (FIG. 10A/10B).

FIG. 11 shows a flow chart for a software (or firmware) program that is used to carry out the read operation (FIG. 9A/9B) and the write operation (FIG. 10A/10B). Specifically, after initialization (step 111), the program retrieves (or reads) the bit-level script (BLS) in step 112. Subsequently, in step 113, the program enables the BCM unit 52, for example, by properly setting and registers triggering, to perform data transfer, i.e., reading or writing the data.

Although specific embodiments have been illustrated and described, it will be appreciated by those skilled in the art that various modifications may be made without departing from the scope of the present invention, which is intended to be limited solely by the appended claims.

What is claimed is:

1. A bit-level memory controller adaptable to managing defect bits of a non-volatile memory, comprising:
   a memory bus interface controller configured to control data communication in a memory bus disposed between the non-volatile memory and the memory controller;
   a bad column management (BCM) unit configured to retrieve a bit-level mapping table, in which defect bits are respectively marked, based on which the BCM unit constructs a bit-level script (BLS) that contains a plurality of entries denoting defect-bit groups respectively;
   an internal buffer configured to store data managed by the BCM unit according to the BLS; and
   a host bus interface controller configured to control data communication in a host bus disposed between a host and the memory controller;
   wherein the BCM unit, in a data read operation, aggregates non-fault data transferred only from consecutive non-defect physical memory locations separated by defect-bit locations denoted by the BLS, and moves the aggregated non-fault data to the internal buffer;
   wherein the BCM unit, in a data write operation, moves the data of the internal buffer toward the non-volatile memory when a target address of the data does not hit the BLS, and the BCM unit appends a dummy bit written to the non-volatile memory when the target address of the data hits the BLS.

2. The memory controller of claim 1, further comprising a first-in-first-out (FIFO) controller that is disposed between the BCM unit and the internal buffer.

3. The memory controller of claim 1, further comprising a first-in-first-out (FIFO) controller that is disposed between the memory bus interface controller and the BCM unit.

4. The memory controller of claim 1, wherein each said entry of the BLS comprises a start bit denoting a location of a beginning defect bit of the corresponding defect-bit group, and a skip bit range denoting a length of the corresponding defect-bit group.

5. The memory controller of claim 1, wherein each said entry of the BLS comprises a start bit denoting a location of a first bit of a bits-group containing a beginning defect bit of the corresponding defect-bit group, and a skip bit range denoting a length of the bits-group or bits-groups containing the corresponding defect-bit group.

6. A bit-level memory controlling method adaptable to managing defect bits of a non-volatile memory, comprising:
   retrieving a bit-level mapping table, in which defect bits are respectively marked;
   constructing a bit-level script (BLS) according to the bit-level mapping table, the BLS containing a plurality of entries denoting defect-bit groups respectively; and
   managing data according to the BLS and then storing the managed data in an internal buffer;
   wherein, in a data read operation, non-fault data transferred only from consecutive non-defect physical memory locations separated by defect-bit locations denoted by the BLS are aggregated, and the aggregated non-fault data are moved to the internal buffer;
   in a data write operation, data of the internal buffer is moved toward the non-volatile memory when a target address of the data does not hit the BLS, and a dummy bit is appended and written to the non-volatile memory when the target address of the data hits the BLS.

7. The memory controlling method of claim 6, further comprising a step of performing error control coding (ECC) on the data before the data is stored in the internal buffer.

8. The memory controlling method of claim 6, wherein each said entry of the BLS comprises a start bit denoting a location of a beginning defect bit of the corresponding defect-bit group, and a skip bit range denoting a length of the corresponding defect-bit group.

9. The memory controlling method of claim 6, wherein each said entry of the BLS comprises a start bit denoting a location of a first bit of a bits-group containing a beginning defect bit of the corresponding defect-bit group, and a skip bit range denoting a length of the bits-group or bits-groups containing the corresponding defect-bit group.

10. A bit-level memory controller adaptable to managing defect bits of a non-volatile memory, comprising:
   a memory bus interface controller configured to control data communication in a memory bus disposed between the non-volatile memory and the memory controller;

a bad column management (BCM) unit configured to retrieve a bit-level mapping table, in which defect bits are respectively marked, based on which the BCM unit constructs a bit-level script (BLS) that contains a plurality of entries denoting defect-bit groups respectively;

an internal buffer configured to store data managed by the BCM unit according to the BLS; and a host bus interface controller configured to control data communication in a host bus disposed between a host and the memory controller;

wherein the BCM unit, in a data write operation, moves the data of the internal buffer toward the non-volatile memory when a target address of the data does not hit the BLS, and the BCM unit appends a dummy bit written to the non-volatile memory when the target address of the data hits the BLS.

11. The memory controller of claim 10, further comprising a first-in-first-out (FIFO) controller that is disposed between the BCM unit and the internal buffer.

12. The memory controller of claim 10, further comprising a first-in-first-out (FIFO) controller that is disposed between the memory bus interface controller and the BCM unit.

* * * * *